United States Patent [19]

Momose

[11] Patent Number: 4,463,493

[45] Date of Patent: Aug. 7, 1984

[54] METHOD FOR MAKING MASK ALIGNED NARROW ISOLATION GROOVES FOR A SEMICONDUCTOR DEVICE

[75] Inventor: Hiroshi Momose, Yokohama, Japan

[73] Assignee: Tokyo Shibaura Denki Kabushiki Kaisha, Japan

[21] Appl. No.: 423,300

[22] Filed: Sep. 24, 1982

[30] Foreign Application Priority Data

Oct. 14, 1981 [JP] Japan .................. 56-162813

[51] Int. Cl.³ .................... H01L 21/22; H01L 21/316
[52] U.S. Cl. ............................. 29/576 B; 29/576 W; 29/571; 148/1.5; 156/628; 156/643
[58] Field of Search ......... 148/1.5; 29/576 W, 576 B, 29/571; 156/628, 643

[56] References Cited

U.S. PATENT DOCUMENTS

| | | | |
|---|---|---|---|
| 4,053,349 | 11/1977 | Simko | 156/628 |
| 4,135,954 | 1/1979 | Chang et al. | 148/187 |
| 4,274,909 | 6/1981 | Venkataraman et al. | 29/571 |
| 4,333,794 | 6/1982 | Beyer et al. | 29/571 |
| 4,362,597 | 12/1982 | Fraser et al. | 156/643 |
| 4,390,393 | 6/1983 | Ghezzo et al. | 156/643 |

FOREIGN PATENT DOCUMENTS 53-35374  4/1978  Japan .................. 29/576 B

OTHER PUBLICATIONS

Japanese Patent Disclosure (Kokai), No. 55-154748 and 55-154770, Y. Nagakubo, (May 23, 1979).

Primary Examiner—Upendra Roy
Attorney, Agent, or Firm—Finnegan, Henderson, Farabow, Garrett & Dunner

[57] ABSTRACT

A method for making mask aligned narrow isolation grooves for a semiconductor device in which an insulating layer is filled in a groove of the semiconductor substrate to form an island region surrounded by the insulating layer, which comprises the steps of forming a mask pattern on a major surface of the semiconductor substrate in such a manner that its side wall is at a taper angle of 90° or less with respect to a major surface of the semiconductor substrate; ion-implanting an impurity of a conductivity type opposite to that of the semiconductor substrate into the semiconductor substrate using the mask pattern; causing a groove for the insulating material to be formed in the semiconductor substrate around the side wall of the mask pattern; filling the groove with insulating material to form a narrow insulating layer; and diffusing the implanted impurity to form an isolation region surrounded by the insulating material.

13 Claims, 11 Drawing Figures

METHOD FOR MAKING MASK ALIGNED NARROW ISOLATION GROOVES FOR A SEMICONDUCTOR DEVICE

BACKGROUND OF THE INVENTION

The present invention relates to a method of manufacturing a semiconductor device and, more particularly, to a method suitably adapted for forming an isolation region between a well region and a semiconductor substrate of a complementary semiconductor device.

Some semiconductor devices have two types of transistors having different polarities on a single semiconductor substrate. For example, a CMOS (Complementary MOS) among various MOS (Metal Oxide Semiconductor) devices has a p-channel transistor and an n-channel transistor. A bipolar transistor among various bipolar devices has an npn transistor and a pnp transistor. In a semiconductor device of this type, if one of the transistors is formed within the semiconductor substrate, the other is formed in an impurity region (generally a well region) of the opposite conductivity type in the semiconductor substrate. The transistors are isolated at the boundary between the well region and the semiconductor substrate. However, in a CMOS transistor, for example, since the p- and n-channel transistors are present on a single semiconductor substrate, defective modes are caused such as the turn-on phenomenon of a parasitic thyristor (so-called latch-up phenomenon) or various breakdown phenomena. In order to prevent such defective modes, possible reduction in the clearance between the p- and n-channel transistors is greatly limited. As a result of this, the clearance margin must be made relatively large.

In order to reduce the clearance between the p- and n-channel transistors without causing the defective modes as described above, the formation of an insulating film in the boundary region between both transistors is known to be effective.

A conventional method for forming such an insulating film (element isolation region) typically comprises the step of ion-implanting an impurity of the opposite conductivity type to that of a semiconductor substrate into a desired region thereof by the photoetching process (PEP), and diffusing the ion-implanted impurity by annealing to a predetermined depth (e.g., 5 μm), thereby forming a well region in the semiconductor substrate; and forming an insulating film in a boundary region between the well region and the semiconductor substrate by PEP again.

However, in this conventional method, two PEP steps are required so that mask misalignment (e.g., 0.5 μm) which might occur during the two PEP steps must be considered. This impairs micronization and requires one to determine, in advance, the lateral diffusion of the impurity (well region).

SUMMARY OF THE INVENTION

It is an object of the present invention to provide a method of manufacturing a semiconductor device wherein an element isolation region may be formed by PEP in self-alignment and in a desired position between a semiconductor substrate and a well region, so that lateral diffusion of the well region may be prevented and micronization is facilitated.

In order to achieve the above object of the present invention, there is provided a method of making mask aligned narrow isolation grooves for a semiconductor device in which an insulating layer is filled in the groove of the semiconductor substrate to form an island region surrounded by the insulating layer, which comprises the steps of forming a mask pattern on a major surface of the semiconductor substrate in such a manner that its side wall is at a taper angle of 90° or less with respect to the major surface of the semiconductor substrate; ion implanting an impurity of a conductivity type opposite to that of the semiconductor substrate into the semiconductor substrate using the mask pattern; forming a narrow groove for the insulating material in the semiconductor substrate around the side wall of the mask pattern; filling the groove with insulating material to form a narrow insulating layer; and diffusing the implanted impurity to form an island region surrounded by the insulating material.

DETAILED DESCRIPTION OF THE PREFERRED EMBODIMENTS

Figure 1A:
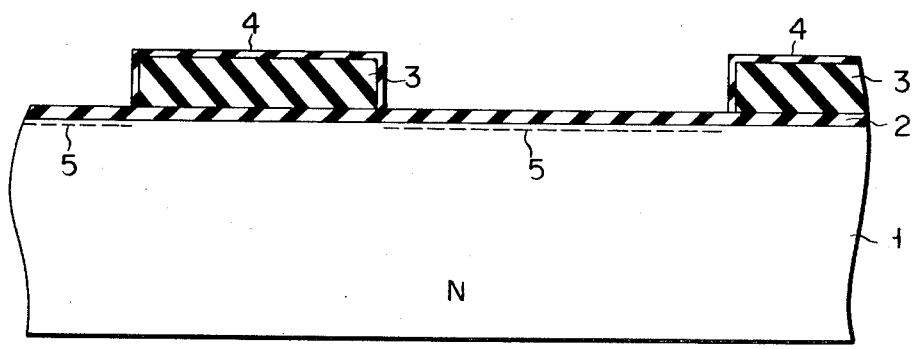
FIGS. 1A to 1F are sectional views showing the manufacturing steps of a semiconductor device according to a first embodiment of the present invention.

The first embodiment of the present invention will now be described with reference to the accompanying drawings. The first embodiment will be described with reference to a structure wherein a p-type region (well region) is formed in an n-type silicon substrate. As shown in FIG. 1A, an insulating film such as a silicon oxide film 2 is formed on an n-type silicon substrate 1 by thermal oxidation or the like. The insulating film may comprise a silicon nitride film or the like. Thereafter, a film such as a polycrystalline silicon film 3 is formed on the entire surface of the silicon oxide film 2. The film 3 may alternatively comprise silicon nitride; a metal such as aluminum, molybdenum or tantalum; an intermetallic compound such as a silicide; and the like. A photoresist film is formed by a known photolithographic process on a desired portion (a region excluding a prospective p-type well region) of the surface of the polycrystalline silicon film 3. The polycrystalline silicon film 3 is etched by a known etching technique such as anisotropic reactive ion etching using the photoresist film as a mask. A pattern of the polycrystalline silicon film 3 is formed which has vertical or reversely tapered side walls.

An insulating film such as a silicon oxide film 4 is formed on the surface of the pattern of the polycrystalline silicon film 3. The thickness of the silicon oxide film 4 is smaller than that of the silicon oxide film 2. The silicon oxide film 4 may be formed by thermal oxidation or by the CVD (Chemical Vapor Deposition) process. Thereafter, a p-type impurity (e.g., boron) is ion-implanted into the silicon substrate 1 to form an impurity injection layer 5.

Figure 1B:
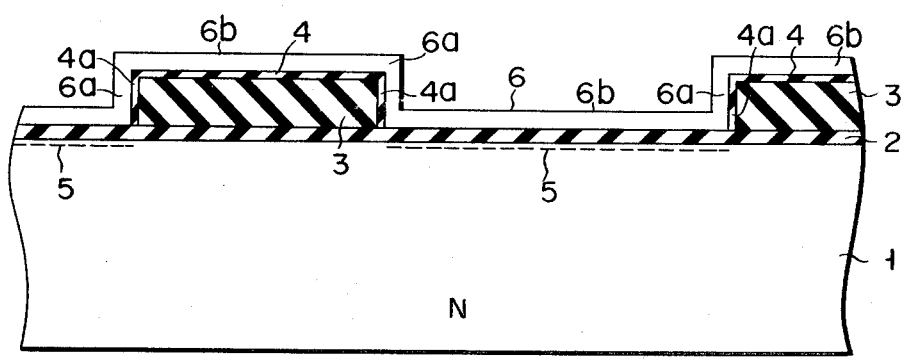

Subsequently, as shown in FIG. 1B, a silicon film such as a polycrystalline silicon film 6 is formed by a known film forming method (e.g., the CVD process, sputtering, or vapor deposition). The film 6 may alternatively comprise amorphous silicon. The conditions for forming the polycrystalline silicon film 6 are such that polycrystalline silicon is deposited on at least a region, excluding regions 4a, of the silicon oxide film 4 which are on the side surfaces of the polycrystalline silicon film 3. Boron of a high concentration ($5\times10^{19}$ cm$^{-3}$ or higher) is ion-implanted on the entire surface or part thereof (that is, on regions 6b, excluding regions 6a, on the side surfaces of the pattern of the polycrystalline silicon film 3) of the polycrystalline silicon film 6. The regions 6a at the side surfaces of the pattern of the polycrystalline silicon film 3 preferably have a boron concentration of about $1\times10^{19}$ cm$^{-3}$ or lower, and the regions 6b, excluding the regions 6a, preferably have a boron concentration of about $5\times10^{19}$ cm$^{-3}$. In the first embodiment, boron is preferably ion-implanted perpendicularly to the silicon substrate 1. Boron is selected in relation to KOH etching to be described later. Therefore, other ions may be selected if other etching solutions are selected.

Figure 1C:
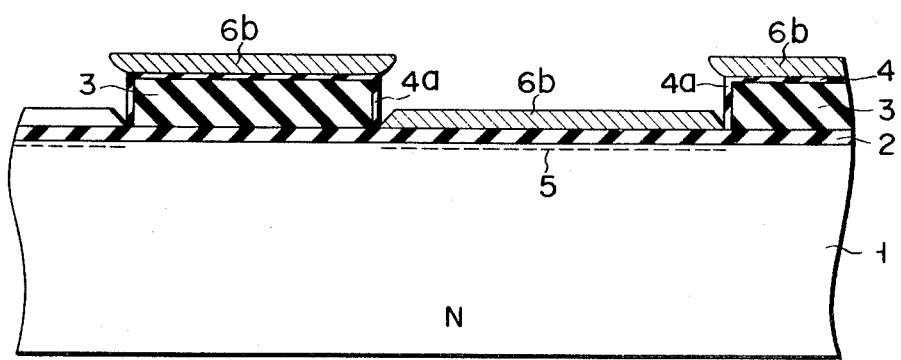
Figure 1D:
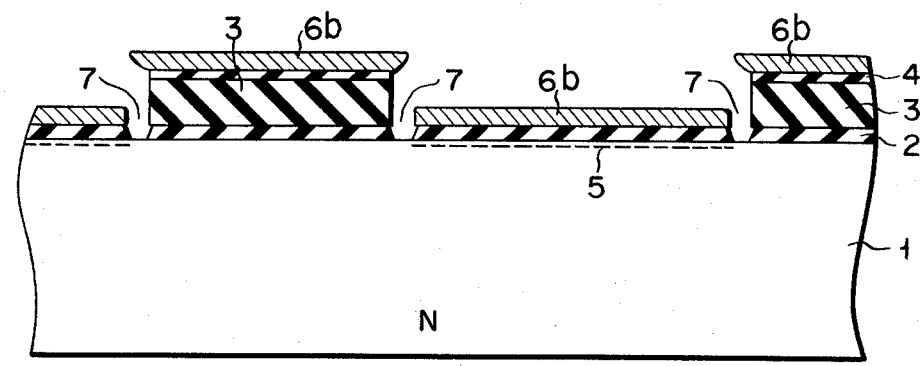

The polycrystalline silicon film 6 is etched using an etching solution containing KOH. Since the regions 6a having a lower boron concentration are etched faster than the regions 6b of higher boron concentration, the regions 4a on the side surfaces of the silicon oxide film 4 are exposed entirely or in part, as shown in FIG. 1C. Subsequently, the regions 4a on the side surfaces of the silicon oxide film 4 are etched. As shown in FIG. 1D, when the regions 4a on the side surfaces of the silicon oxide film 4 are etched, an opening 7 is formed between the side surfaces of the pattern of the polycrystalline silicon film 3 and the regions 6b of the polycrystalline silicon film 6. The silicon oxide film 2 exposed through the opening 7 is etched until part of the silicon substrate 1 is exposed.

Figure 1E:
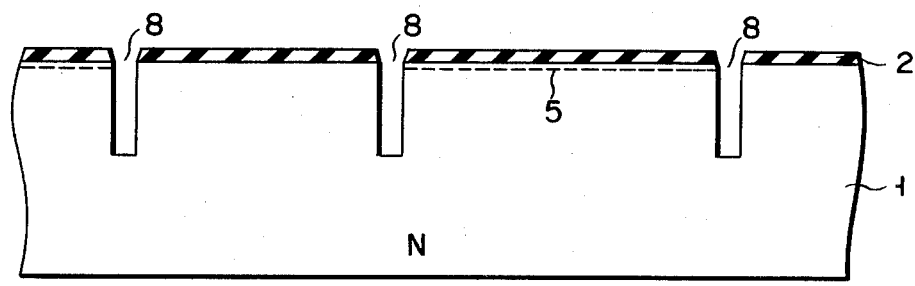
Figure 1F:
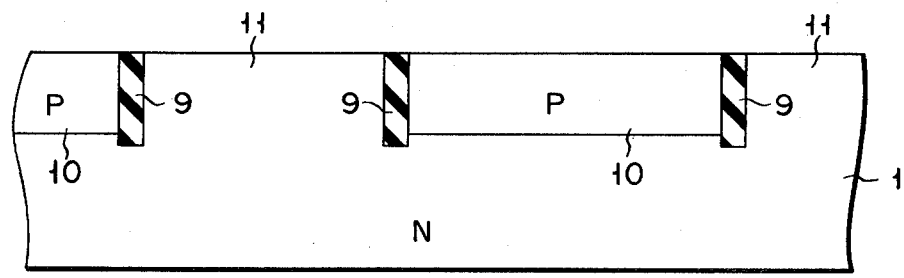

As shown in FIG. 1E, the polycrystalline silicon film 6, the silicon oxide film 4 and the polycrystalline silicon film 3 are sequentially etched. The polycrystalline silicon film 3 is etched by anisotropic etching such as reactive ion etching. At the same time as the polycrystalline silicon film 3 is etched, the silicon substrate 1 is also etched to form an etching groove 8. The surface of the silicon substrate 1 excluding the etching groove 8 is covered with the silicon oxide film 2. Using the silicon oxide film 2 as a mask, the etching groove 8 is further etched to a desired depth or a depth of the prospective p-type well region. Thereafter, as shown in FIG. 1F, an insulating film 9 is formed in the etching groove 8. The insulating film 9 may be formed by burying a silicon oxide film within the etching groove 8 by thermal oxidation. Alternatively, an insulator such as SiO$_2$ or SiN may be buried in the etching groove 8 by the CVD process. The impurity (boron) in the impurity injection layer 5 is then thermally diffused to form a p-type well region 10. Thus, the p-type well region 10 and an n-type region 11 are isolated by the insulating film 9.

An n-channel MOS transistor is formed on the p-type well region 10 and a p-channel MOS transistor is formed on the n-type region 11 according to the conventional CMOS process, to complete a CMOS device.

In the first embodiment described above, a p-type well region is formed in an n-type substrate. However, an n-type well region may alternatively be formed in a p-type substrate. After boron is ion-implanted in the polycrystalline silicon film 6, annealing may be performed to activate the ion-implanted boron. Prior to the ion-implantation of boron, a thin insulating film may be formed on the surface of the polycrystalline silicon film 6.

The dose of boron may be freely selected such that the concentration of the polycrystalline silicon film 6 may not exceed about $5\times10^{19}$ cm$^{-3}$.

According to the first embodiment described above, the insulating film 9 may be formed at any position between the n-type region 11 and the p-type well region 10 of the silicon substrate 1 by a single photoetching step and in self-alignment. For this reason, mask misalignment as is encountered with the conventional method need not be considered in circuit designing, and the distance between the p- and n-channel transistors may be reduced, resulting in higher micronization. The first embodiment of the present invention also prevents the defective modes of the CMOSs such as the latch-up phenomenon. After the insulating film 9 is formed, thermal diffusion of the impurity in the impurity injection layer 5 is performed. Therefore, lateral diffusion of the impurity may be prevented. Moreover, the width, depth, and shape of the insulating film 9 may be freely selected.

Figure 2A:
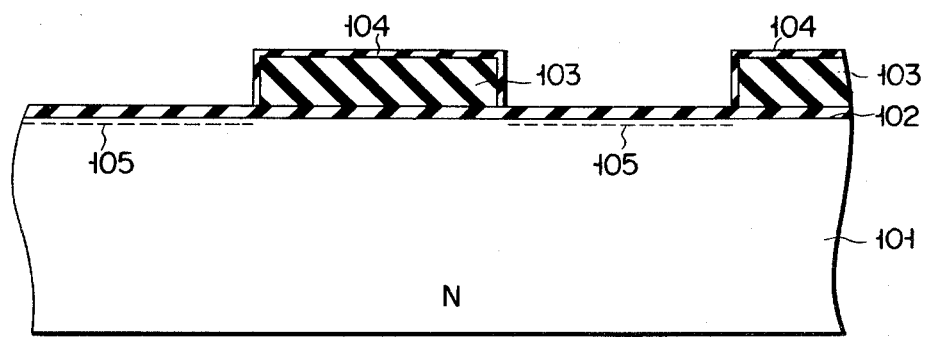
FIGS. 2A to 2E are sectional views showing the manufacturing steps of a semiconductor device according to a second embodiment of the present invention.

The second embodiment of the present invention will now be described. In the second embodiment, a p-type well region is formed in an n-type silicon substrate as in the case of the first embodiment. As shown in FIG. 2A, an insulating film such as a silicon oxide film 102 is formed on an n-type silicon substrate 101 by thermal oxidation. Thereafter, a film such as a polycrystalline silicon film 103 is formed on the entire surface of the silicon oxide film 102. The film 103 may alternatively comprise silicon nitride; a metal such as aluminum or tantalum; or an intermetallic compound such as a silicide. A photoresist film is formed by photolithography on a desired portion (a region excluding the prospective p-type well region) of the surface of the polycrystalline silicon film 103. Using the photoresist film as a mask, the polycrystalline silicon film 103 is etched by a known etching technique such as anisotropic reactive ion etching to form a pattern of the polycrystalline silicon film 103. An insulating film such as a silicon oxide film 104 is formed on the surface of the polycrystalline silicon film 103. The thickness of the silicon oxide film 104 is selected to be smaller than that of the silicon oxide film 102. The silicon oxide film 104 may be formed by thermal oxidation or by the CVD process. A p-type impurity (e.g., boron) is ion-implanted into the silicon substrate 101 to form an impurity injection layer 105 therein.

Figure 2B:
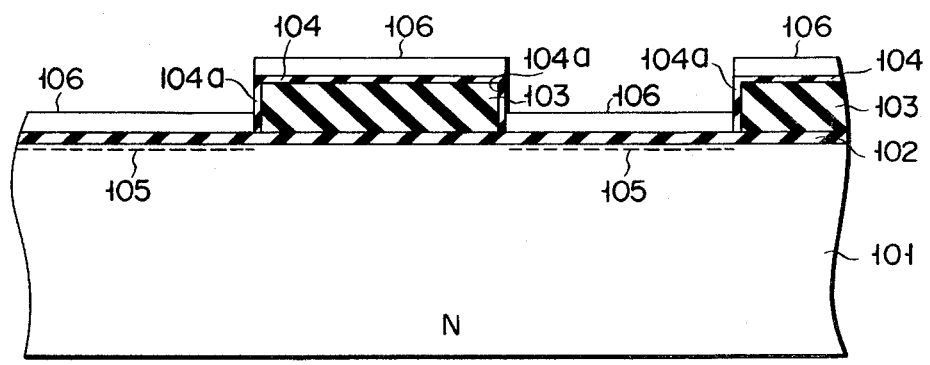

As shown in FIG. 2B, a film such as a polycrystalline silicon film 106 is formed by an anisotropic film forming method (a film deposition method wherein particles are vertically bombarded against the silicon substrate 101 to be deposited thereon, such as sputtering, vapor deposition; the preferred method is ion beam sputtering which provides good linearity). The film 106 must comprise a material which may serve as a mask for etching the silicon oxide films 102 and 104 and may therefore alternatively comprise silicon nitride; a metal such as molybdenum, tungsten, tantalum or aluminum; or an intermetallic compound such as a silicide. The conditions for forming the polycrystalline silicon film 106 are such that is may not be formed on the entire or on any part of regions 104a of the silicon oxide film 104. If the area where the polycrystalline silicon film 106 is not deposited is too small, the polycrystalline silicon film 106 is etched by a known etching technique (e.g., a wet method using an etching solution, or an isotropic plasma etching method).

Figure 2C:
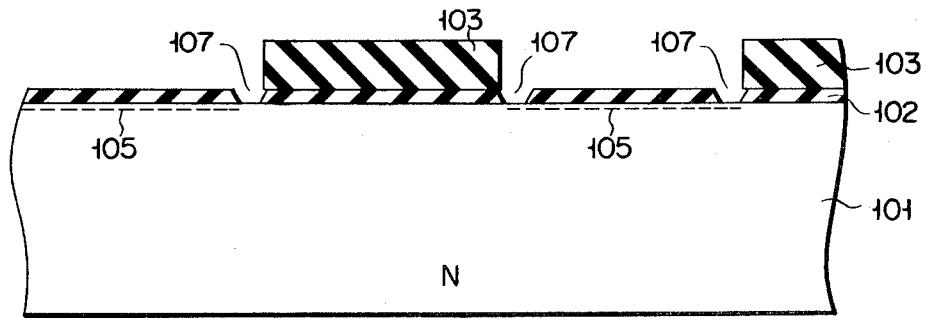
Figure 2D:
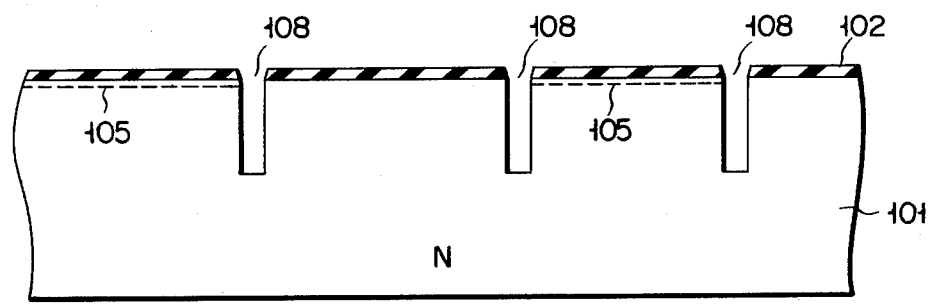
Figure 2E:
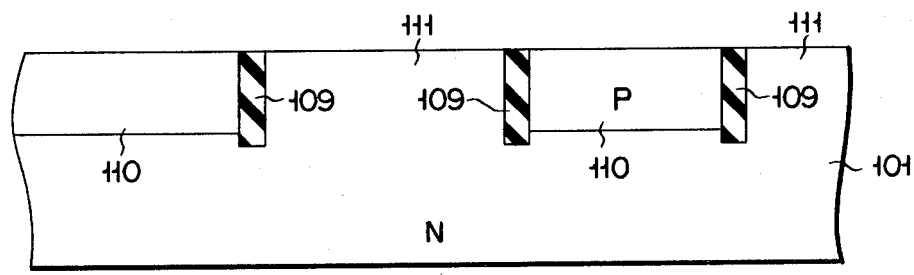

As shown in FIG. 2C, the regions 104a of the silicon oxide film 104 are etched by a known etching technique. Using the etched part as a window, the silicon oxide film 102 below the regions 104a is etched. Subsequently, the polycrystalline silicon film 106 and the silicon oxide film 104 covered thereby are etched. In this state, the surface of the silicon substrate 101 is covered with the silicon oxide film 102 except for regions 107 in the vicinities of the ends of the pattern of the polycrystalline silicon film 103. Thereafter, as shown in FIG. 2D, after the polycrystalline silicon film 103 is etched, the silicon substrate 101 is etched by anisotropic reactive ion etching to form an etching groove 108 of a desired depth. As shown in FIG. 2E, an insulating layer 109 is formed in the etching groove 108. The insulating film 109 may be formed by forming a silicon oxide film within the etching groove 108 by thermal oxidation. The insulating film 109 may also be formed by burying an insulator such as $SiO_2$ or SiN by the CVD process. After the surface of the silicon substrate 101 is smoothed and the entire surface thereof is exposed, the impurity in the impurity injection layer 105 is thermally diffused to form a p-type well region 110. The p-type well region 110 and an n-type region 111 in the silicon substrate 101 are isolated by the insulating layer 109. The CMOS device is the completed by the conventional method.

In the first embodiment, the polycrystalline silicon film 6 of a uniform thickness is formed on the top and side surfaces of the silicon oxide film 4, and the polycrystalline silicon film 6 on the side surfaces of the silicon oxide film 4 is thereafter etched. In contrast to this, in the second embodiment, the polycrystalline silicon film 106 is deposited only in the vertical direction by anisotropic deposition. Therefore, the polycrystalline silicon film 106 is not deposited on the side surfaces of the silicon oxide film 104 from the beginning. Except in this feature, the second embodiment is the same as the first embodiment, and similar effects may be obtained.

Although the first and second embodiments are described with reference to a CMOS structure, the present invention is not limited to this. For example, the present invention may be similarly applied to a bipolar structure comprising an npn transistor and a pnp transistor. The semiconductor substrate may comprise a substrate of a III-V group compound such as GaAs in place of the silicon substrate.

What is claimed is:

1. A method of making mask aligned narrow isolation grooves for a semiconductor device having an insulating layer filled in the groove of a semiconductor substrate to form an island region surrounded by the insulating layer, the method comprising the steps of:

forming a mask pattern on a major surface of the semiconductor substrate in such a manner that side wall of the mask is at a taper angle of 90° or less with respect to the major surface of the semiconductor substrate;

ion-implanting an impurity of a conductivity type opposite to that of the semiconductor substrate into the semiconductor substrate using the mask pattern;

forming a narrow groove in a portion of said semiconductor substrate adjacent to the side wall of the mask pattern;

filling said groove with insulating material to form a narrow insulating layer; and diffusing the implanted impurity to form an island region surrounded by said insulating material.

2. A method according to claim 1, wherein said mask pattern is formed on said semiconductor substrate through a first insulating film.

3. A method according to claim 1, wherein said mask pattern is formed by anisotropic etching of a polycrystalline silicon film.

4. A method according to claim 1, wherein said mask pattern is formed by anisotropic etching of a silicon nitride film.

5. A method according to claim 2, wherein a second insulating film of a thickness smaller than a thickness of said first insulating film is formed on a surface of said mask pattern.

6. A method according to claim 5, wherein a film is formed on said first and second insulating films, said film is subjected to an anisotropic treatment in a direction perpendicular to said semiconductor substrate, un-treated portions of said first and second insulating films are etched to form an opening, and said groove is formed through said opening.

7. A method according to claim 5, wherein a film is formed by an anisotropic etching method on said first and second insulating films excluding portions corresponding to said side surfaces of said mask pattern, said first and second films are etched using said film as a mask to form an opening, and said groove is formed through said opening.

8. A method according to claim 6, wherein said anisotropic treatment comprises ion-implantation of an impurity into said film.

9. A method according to claim 6, wherein said groove is formed by anisotropic etching.

10. A method according to claim 8, wherein said film comprises a polycrystalline film.

11. A method according to claim 7, wherein said film forming method comprises ion beam sputtering.

12. A method according to claim 7, wherein said groove is formed by anisotropic etching.

13. A method according to claim 11, wherein said film comprises a polycrystalline film.

* * * * *